United States Patent
Ha

(10) Patent No.: US 7,901,844 B2
(45) Date of Patent: *Mar. 8, 2011

(54) METHOD WITH CORRECTION OF HARD MASK PATTERN CRITICAL DIMENSION FOR FABRICATING PHOTOMASK

(75) Inventor: Tae Joong Ha, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 306 days.

This patent is subject to a terminal disclaimer.

(21) Appl. No.: 12/164,841

(22) Filed: Jun. 30, 2008

(65) Prior Publication Data

US 2009/0075181 A1    Mar. 19, 2009

(30) Foreign Application Priority Data

Sep. 18, 2007   (KR) .................. 10-2007-0094655

(51) Int. Cl.
*G03F 1/08*    (2006.01)
*G03F 1/14*    (2006.01)
(52) U.S. Cl. .......................................... 430/5
(58) Field of Classification Search .............. 430/5
See application file for complete search history.

(56) References Cited

U.S. PATENT DOCUMENTS

| 4,139,443 | A | 2/1979 | Sakurai et al. | |
|---|---|---|---|---|
| 6,989,219 | B2 | 1/2006 | Magg | |
| 2005/0048377 | A1* | 3/2005 | Yang | 430/5 |
| 2007/0026321 | A1* | 2/2007 | Kumar | 430/5 |
| 2009/0053620 | A1* | 2/2009 | Ha | 430/5 |
| 2009/0111035 | A1* | 4/2009 | Lee | 430/5 |

FOREIGN PATENT DOCUMENTS

| KR | 10-2006-0053065 | 5/2006 |
|---|---|---|
| KR | 10 2007 0068910 | 7/2007 |

* cited by examiner

*Primary Examiner* — Stephen Rosasco
*Assistant Examiner* — John Ruggles
(74) *Attorney, Agent, or Firm* — Marshall, Gerstein & Borun LLP

(57) ABSTRACT

A method for fabricating a photomask includes forming a light blocking layer, a hard mask layer, and a resist layer on a transparent substrate, forming a resist pattern to selectively expose the hard mask layer by removing the resist layer selectively, forming a hard mask pattern by etching the exposed hard mask layer using the resist pattern as an etch mask, exposing the hard mask pattern by removing the resist pattern; measuring a critical dimension of the exposed hard mask pattern, correcting the measured critical dimension of the hard mask pattern to correspond to a critical dimension of a target pattern, forming a light blocking pattern by etching the exposed light blocking layer using the corrected hard mask pattern as an etch mask, and removing the hard mask pattern.

7 Claims, 6 Drawing Sheets

METHOD WITH CORRECTION OF HARD MASK PATTERN CRITICAL DIMENSION FOR FABRICATING PHOTOMASK

CROSS-REFERENCE TO RELATED APPLICATION

Priority to Korean patent application number 10-2007-0094655, filed on Sep. 18, 2007, the disclosure of which is incorporated by reference in its entirety, is claimed.

BACKGROUND OF THE INVENTION

1. Field of the Disclosure

The present invention relates to a method for fabricating a semiconductor device, and more particularly, to a method for fabricating a photomask.

2. Brief Description of Related Technology

In a process of fabricating a semiconductor device, a photomask onto which a pattern is formed is used for patterning the semiconductor substrate. The pattern of the photomask is transferred onto a wafer by a photolithography process. Accordingly, the manufacturing process of the photomask is considered to be very significant. As semiconductor devices become more highly integrated, the patterns on the photomask are formed with a smaller critical dimension (CD). In the fabrication of the photomask, margin reduction in the etching process and foreign materials on a resist layer may create patterns having CDs different from the CD of a target pattern.

For the CD accuracy of a pattern on a photomask, a CD correction process to correct the CD of a photomask pattern is performed after the fabrication of the photomask. After all the processes in the fabrication of a photomask have been completed, the first step in the correction process is to measure the CD of a mask pattern on the photomask. The CD of the mask pattern is compared with that of a target pattern to check whether the CD of the mask pattern corresponds to that of the target pattern. The CD of the mask pattern is corrected by additionally etching the mask pattern by a difference between the CD of the mask pattern and the CD of a target pattern.

The additional etching of the mask pattern is performed using a separate correction mask after all the processes in the fabrication of a photomask have been completed. The separate correction mask may increase processing time and fabrication cost because it involves an additional resist coating process and exposure and development process. Furthermore, foreign materials left by the additional processes may degrade the quality of the photomask, and influences of the fabrication processing environments and equipment make it difficult to ensure pattern reproducibility.

SUMMARY OF THE INVENTION

Disclosed herein are methods for fabricating a photomask.

In one embodiment, a method for fabricating a photomask includes: forming a light blocking layer, a hard mask layer, and a resist layer on a transparent substrate; forming a resist pattern to selectively expose the hard mask layer by removing the resist layer selectively; forming a hard mask pattern by etching the exposed hard mask layer using the resist pattern as an etch mask; exposing the hard mask pattern by removing the resist pattern; measuring a CD of the exposed hard mask pattern; correcting the measured CD of the hard mask pattern to correspond to a CD of a target pattern; forming a light blocking pattern by etching the exposed light blocking layer using the corrected hard mask pattern as an etch mask; and removing the hard mask pattern.

In another embodiment, a method for fabricating a photomask includes: forming a phase shift layer, a light blocking layer, a hard mask layer and a resist layer on a transparent substrate including a first region and a second region; forming a resist pattern to selectively expose the hard mask layer by removing the resist layer selectively; forming a hard mask pattern by etching the exposed hard mask layer using the resist pattern as an etch mask; exposing the hard mask pattern by removing the resist pattern; measuring a CD of the exposed hard mask pattern; correcting the CD of the hard mask pattern to correspond to a CD of a target pattern; forming a phase shift pattern and a light blocking pattern by etching the exposed light blocking layer and phase shift layer using the corrected hard mask pattern as an etch mask; removing the hard mask pattern; and selectively removing the light blocking pattern on the first region to expose the phase shift pattern on the first region.

Additional features of the invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawings.

Figure 1:
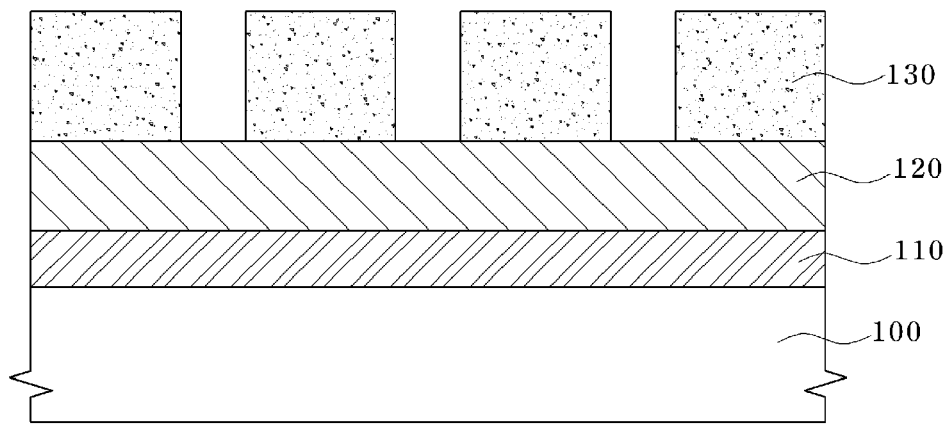
FIGS. 1 to 5 illustrate a method for fabricating a photomask according to one embodiment of the present invention.

While the disclosed methods are susceptible to embodiments in various forms, specific embodiments are illustrated in the drawings (and will hereafter be described), with the understanding that the disclosure is intended to be illustrative, and is not intended to limit the invention to the specific embodiments described and illustrated herein.

DESCRIPTION OF SPECIFIC EMBODIMENTS

Hereinafter, methods for fabricating a photomask will be described in detail with reference to the accompanying drawings.

Embodiment 1

A method for fabricating a photomask according to one embodiment will be described below. Referring to FIG. 1, a light blocking layer 110 and a hard mask layer 120 are formed on a transparent substrate 100 formed of a material such as quartz. The light blocking layer 110 may be formed of a layer material, e.g., chromium (Cr), which is capable of shielding transmitted light. When the light blocking layer is formed of chromium (Cr), the hard mask layer 120 may be formed of, but is not limited to, silicon oxynitride (SiON) or molybdenum silicon nitride (MoSiN) or cabon (C). A lithography process is performed and then a resist pattern 130 is formed to selectively expose the hard mask layer. For this purpose, a resist layer is formed on the transparent substrate 100 on which the light blocking layer 110 and the hard mask layer 120 are formed. An exposure process is performed on the resist layer using an electron beam. A development process is performed on the exposed resist layer using a developing solution. And then, a portion, which is irradiated by the electron beam, or another portion, which is not irradiated by the electron beam, are selectively developed. As a result, the resist pattern 130 is formed to selectively expose the hard mask layer 120.

Figure 2:
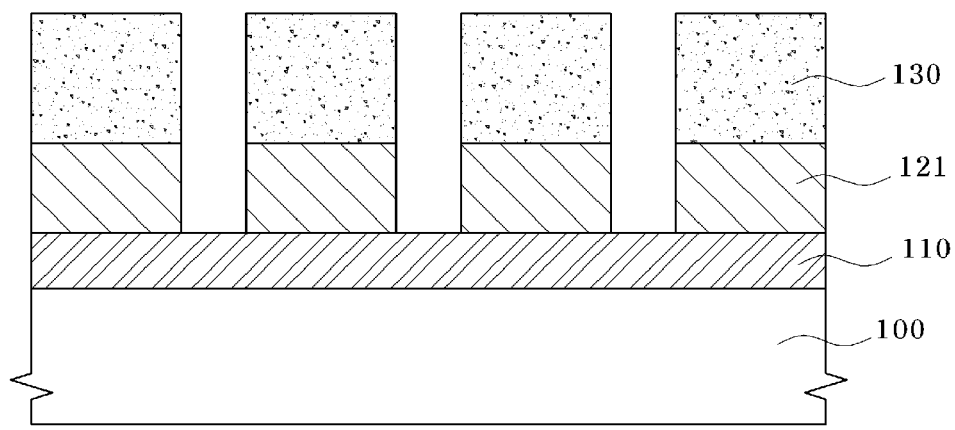

Referring to FIG. 2, a hard mask pattern 121 is formed by etching the exposed hard mask layer using the resist pattern 130 of FIG. 1 as an etch mask. The hard mask pattern 121 is used as an etch barrier layer when the light blocking layer is subsequently etched. Accordingly, a CD of the light blocking pattern to be subsequently formed is determined by the CD of the hard mask pattern 121.

Figure 3:
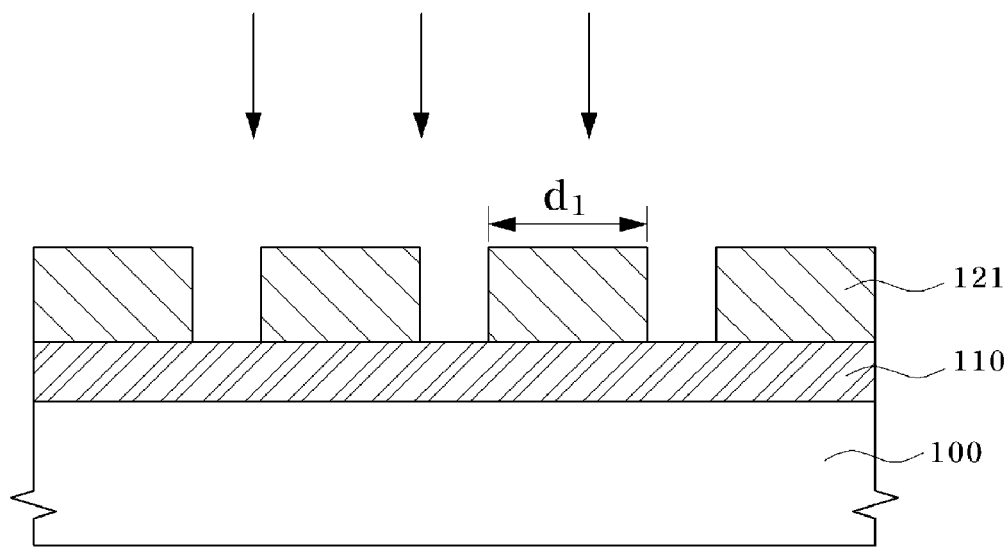

Referring to FIG. 3, a strip process is performed to remove the resist pattern, and a CD $d_1$ of the hard mask pattern 121 is measured using a critical dimension measuring apparatus. The difference between the measured CD of the hard mask pattern and a CD of a target pattern is calculated. Without intending to be bound by any particular theory, it is believed that this difference can be caused by process instability and the lack of processability. After the resist layer has been removed, a cleaning process may be performed. The cleaning process can remove foreign materials, such as particles caused to be left during formation of the hard mask pattern 121. Therefore, bridging defect patterns, wherein the light blocking layers are bridged together, may be prevented during the etching process.

Figure 4:
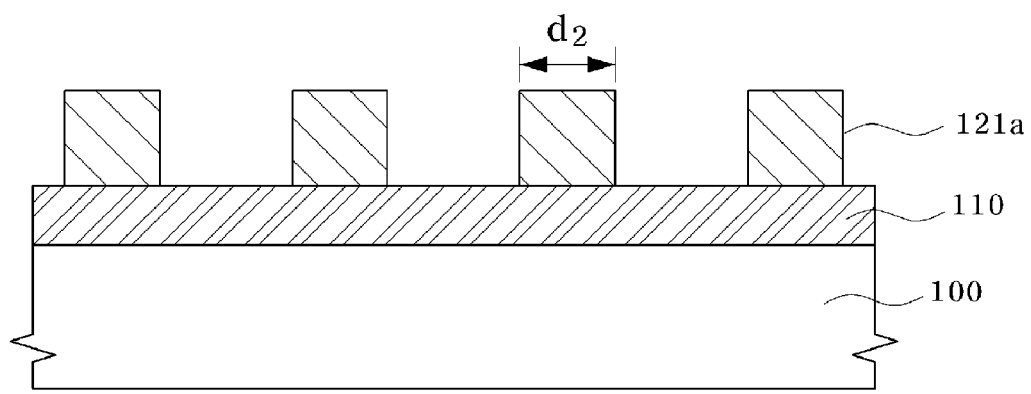

Referring to FIG. 4, the CD of the hard mask pattern 121a is corrected. Specifically, the measured CD $d_1$ of the hard mask pattern and the CD of a target pattern are compared, and a correction value is calculated based on the difference in CD values. The hard mask pattern is etched additionally based on the calculated correction value. The CD of the light blocking pattern to be subsequently formed is determined by the CD $d_2$ of the corrected hard mask pattern 121a. Therefore, the accuracy of the light blocking pattern CD may be enhanced by correcting the CD of the hard mask pattern 121a before the light blocking layer is etched. After the CD correction process has been performed on the hard mask pattern 121a, the CD of the corrected hard mask pattern 121a is measured again. The CD of the hard mask pattern may be corrected again until the CD of the target pattern is obtained. Because the hard mask pattern 121a is relatively higher than the photoresist layer in etching durability, pattern reproducibility may be ensured.

Figure 5:
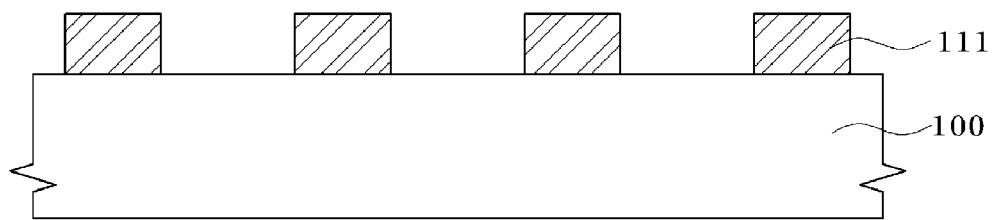

Referring to FIG. 5, a light blocking pattern 111 is formed by etching the exposed light blocking layer using the corrected hard mask pattern 121a in FIG. 4 as an etch mask. A light blocking pattern 111 may be formed with a vertical sidewall profile. Accordingly, a CD correction process may be performed in the photomask fabrication process without a separate correction mask, thereby reducing processing time and fabrication cost. In addition, reproducibility of the pattern CD during the correction process may be improved, and CD accuracy may be enhanced.

Embodiment 2

Figure 6:
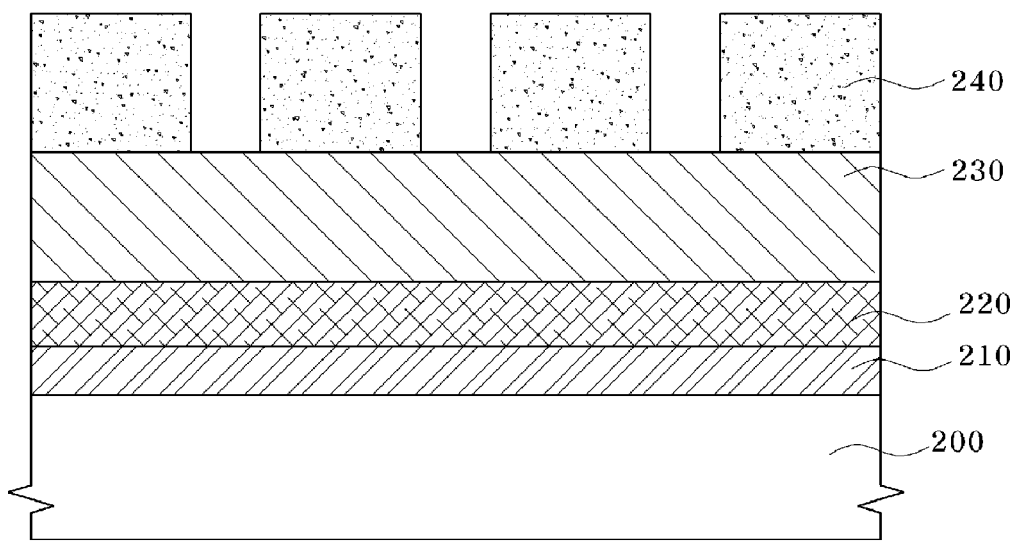
FIGS. 6 to 12 illustrate a method for fabricating a photomask according to another embodiment of the present invention.

A method for fabricating a photomask according to another embodiment will be described below. Referring to FIG. 6, a phase shift layer 210, a light blocking layer 220, and a hard mask layer 230 are formed on a transparent substrate 200, such as a quartz substrate. The transparent substrate may be divided into a main pattern region on which a phase shift pattern is disposed, and a frame region on which a phase shift pattern and a light blocking pattern are disposed. The phase shift layer 210 may be formed of a material capable of shifting the phase of the transmitted light, for example, molybdenum silicon nitride (MoSiN). The light blocking layer 220 may be formed of a material capable of shielding the transmitted light, for example, chromium (Cr). The hard mask layer 230 may be formed of a material layer with high selectivity etch rate to the light blocking layer 220. When the light blocking layer 220 is formed of chromium (Cr), the hard mask layer 230 may be formed of, but is not limited to, silicon oxynitride (SiON) or molybdenum silicon nitride (MoSiN) or cabon(C).

A lithography process is performed to form a resist pattern 240 which exposes a hard mask layer 230. For this purpose, a resist layer is formed on the transparent substrate 100 on which the phase shift layer 210, the light blocking layer 220, and the hard mask layer 230 are disposed. An exposure process is performed on the resist layer using an electron beam. A development process is performed on the exposed resist layer using a developing solution. Then, one portion which is irradiated and the other portion which is not irradiated by the electron beam are selectively developed and the resist pattern 240 is formed to selectively expose the hard mask layer 230.

Figure 7:
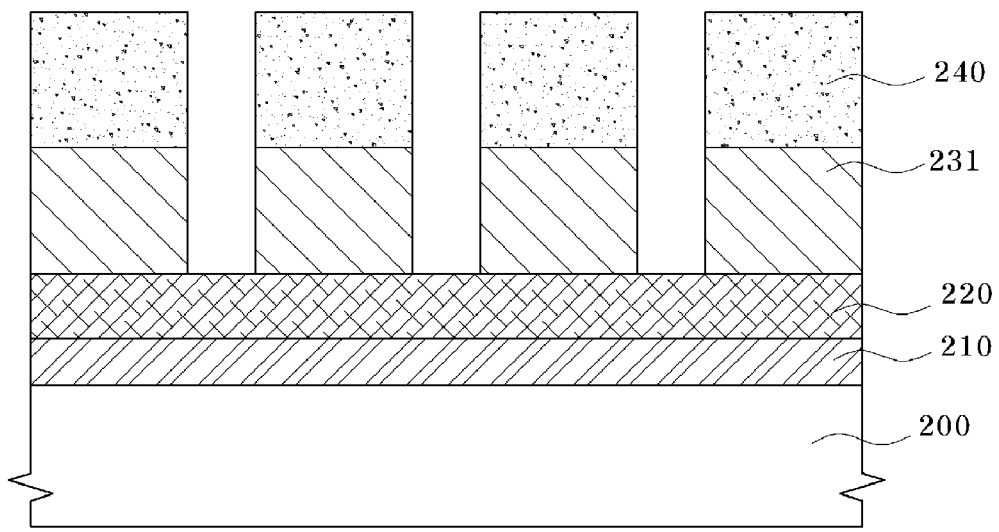

Referring to FIG. 7, a hard mask pattern 231a is formed by etching the exposed hard mask layer using the resist pattern 240 as an etch mask. The hard mask pattern 231a is used as an etch barrier layer when the light blocking layer 220 is subsequently etched. Therefore, the CD of the subsequently-formed light blocking pattern 221 (see FIG. 10) is determined by the CD of the hard mask pattern 231a.

Figure 8:
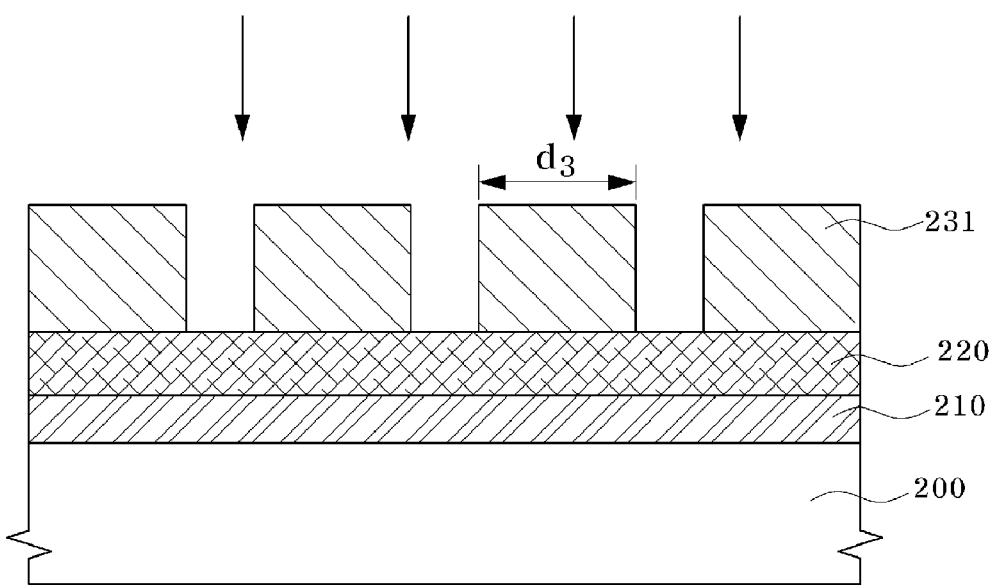

Referring to FIG. 8, after the resist pattern is removed through a strip process, a CD $d_3$ of the hard mask pattern is measured with a CD measuring apparatus. The CD of the hard mask pattern 231 is measured, and the difference between the measured CD and a CD of a target pattern may be calculated. Without intending to be bound by any particular theory, it is believed that this difference may be caused by process instability and the lack of processability. After the resist layer has been removed, a cleaning process may be performed. The cleaning process may remove foreign materials, such as particles caused to be left during the formation of the hard mask pattern 121. Therefore, bridging defect patterns (wherein the light blocking layers are bridged together) can be reduced or prevented during the etching process.

Figure 9:
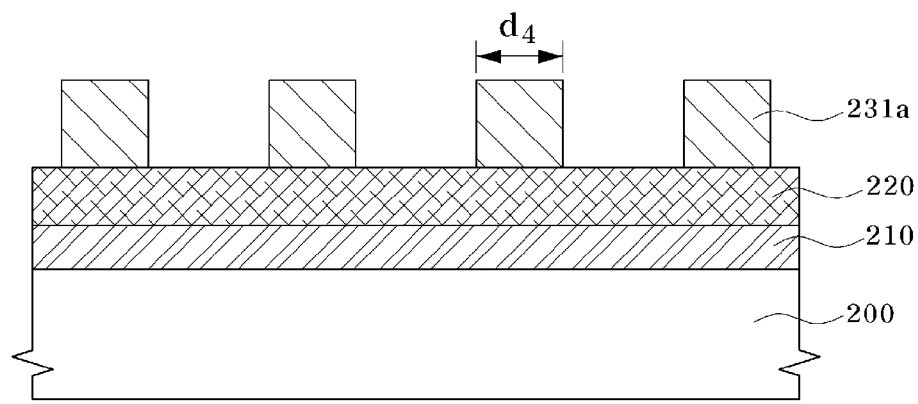

Referring to FIG. 9, the CD of the hard mask pattern 231 in FIG. 8 is corrected. Specifically, the measured CD $d_3$ of the hard mask pattern and the CD of a target pattern are compared, and a correction value is calculated. The hard mask pattern is etched additionally according to the calculated correction value. The additional etching may be performed by a dry or a wet etching process. The CD of the light blocking pattern to be subsequently formed is determined by the CD $d_4$ of the corrected hard mask pattern 231a. Accordingly, the accuracy of the light blocking pattern CD may be enhanced by correcting the CD of the hard mask pattern 231a before the light blocking layer is etched. After the CD correction process has been performed on the hard mask pattern 231a, the CD of the corrected hard mask pattern 231a is measured again. The CD of the hard mask pattern 231a may be corrected again until the CD of the target pattern is obtained. Because the hard mask pattern 231a is relatively higher than the photoresist layer in etch durability, pattern reproducibility may be ensured.

Figure 10:
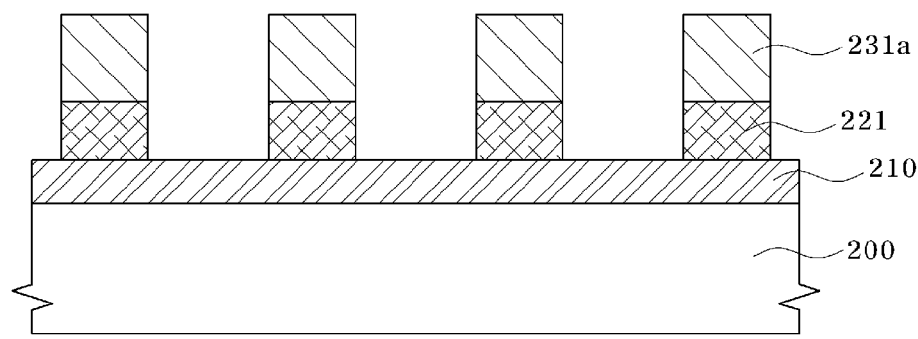

Referring to FIG. 10, a light blocking pattern 221 is formed by etching the exposed light blocking layer using the corrected hard mask pattern 231a as an etch mask. In addition, the light blocking pattern 221 may be formed with a vertical sidewall profile when it is etched.

Figure 11:
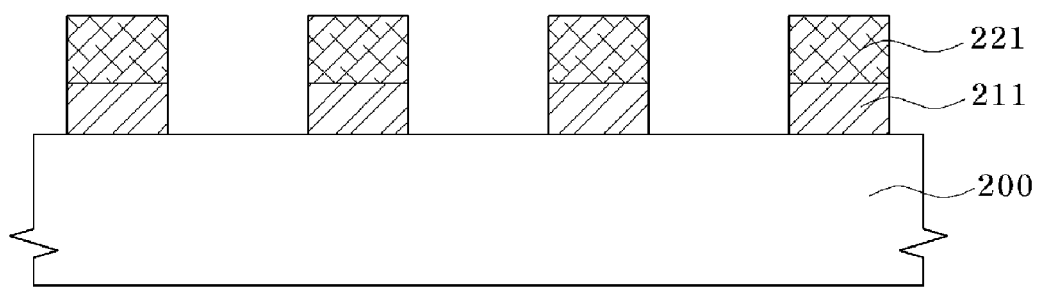

Referring to FIG. 11, a phase shift pattern 211 is formed by etching the exposed phase shift layer using the corrected hard mask pattern 231a and the light blocking pattern 221 as an etch mask. The hard mask pattern may be etched together during the etching process for the formation of the phase shift pattern 221. Accordingly, the CD correction process may be performed in the photomask fabrication process without a separate correction mask, thereby reducing processing time and fabrication costs. In addition, reproducibility of the pattern CD during the correction process may be improved, and CD accuracy may be enhanced.

Figure 12:
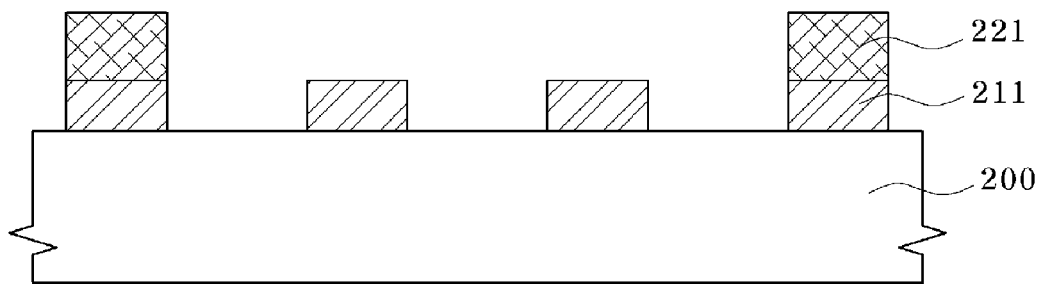

Referring to FIG. 12, a phase shift pattern 211 is formed on a portion of the main pattern region of the transparent substrate 200 by selectively etching the light blocking pattern 221. The light blocking pattern 221 and the phase shift pattern 211 are formed on the frame region of the transparent substrate. For example, a resist pattern (not shown) is formed to expose the main pattern region. The light blocking pattern 221 exposed by the resist pattern is etched selectively. The resist pattern is removed. Thereafter, only the phase shift pattern 211 is on the main pattern region of the transparent substrate 200. The light blocking pattern 221 and the phase shift pattern 211 are on the frame region of the transparent substrate 200. The frame region blocks the unnecessary transmission of light.

The embodiments of the present invention have been disclosed for illustrative purposes. Those skilled in the art will appreciate that various modifications, additions, and substitutions are possible, without departing from the scope and spirit of the invention as recited in the accompanying claims.

What is claimed is:

1. A method for fabricating a photomask comprising:
    forming a chrome layer on a transparent substrate;
    forming a hard mask pattern on the chrome layer, the hard mask pattern comprising a material with etch selectivity with respect to the chrome layer;
    measuring a critical dimension of the hard mask pattern;
    calculating a correction value by comparing the measured critical dimension of the hard mask pattern with a critical dimension of a target pattern;
    etching the hard mask pattern additionally as much as the correction value to form a corrected hard mask pattern;
    forming a chrome pattern by etching the chrome layer using the corrected hard mask pattern as an etch barrier mask; and
    removing the corrected hard mask pattern.

2. The method of claim 1, further comprising forming a light blocking layer, a hard mask layer, and a resist layer on a transparent substrate;
    forming a resist pattern to selectively expose the hard mask layer by selectively removing a portion of the resist layer;
    forming a hard mask pattern by etching the exposed hard mask layer using the resist pattern as an etch mask; and
    exposing the hard mask pattern by removing the resist pattern, to provide the light blocking layer and hard mask pattern on the transparent substrate.

3. A method for fabricating a photomask comprising:
    forming a phase shift layer and a chrome layer on a transparent substrate;
    forming a hard mask pattern on the chrome layer, the hard mask pattern comprising a material with etch selectivity with respect to the chrome layer;
    measuring a critical dimension of the hard mask pattern;
    calculating a correction value by comparing the measured critical dimension of the hard mask pattern with a critical dimension of a target pattern;
    etching the hard mask pattern additionally as much as the correction value to form a corrected hard mask pattern;
    forming a phase shift pattern and a chrome pattern by etching the phase shift layer and the chrome layer using the corrected hard mask pattern as an etch mask;
    removing the corrected hard mask pattern; and
    selectively removing a portion of the chrome pattern on the first region to expose the phase shift pattern on the first region.

4. The method of claim 3, comprising forming the phase shift layer with a molybdenum silicon nitride (MoSiN) layer.

5. The method of claim 3, wherein correcting the measured critical dimension of the hard mask pattern comprises:
    calculating a correction value by comparing the measured critical dimension of the hard mask pattern with the critical dimension of the target pattern; and
    etching the hard mask pattern additionally by the correction value.

6. The method of claim 1, wherein the hard mask pattern comprises a material comprising silicon oxynitride (SiON), molybdenum silicon nitride (MoSiN), or carbon(C).

7. The method of claim 3, wherein the hard mask pattern comprises a material comprising silicon oxynitride (SiON), molybdenum silicon nitride (MoSiN), or carbon (C).

* * * * *